US010389324B2

(12) United States Patent
Iwata

(10) Patent No.: US 10,389,324 B2
(45) Date of Patent: Aug. 20, 2019

(54) AUDIO REPRODUCTION DEVICE

(71) Applicant: Panasonic Intellectual Property Management Co., Ltd., Osaka (JP)

(72) Inventor: Kazuya Iwata, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/072,224

(22) PCT Filed: Sep. 16, 2016

(86) PCT No.: PCT/JP2016/004236
§ 371 (c)(1),
(2) Date: Jul. 24, 2018

(87) PCT Pub. No.: WO2017/141292
PCT Pub. Date: Aug. 24, 2017

(65) Prior Publication Data
US 2019/0028080 A1    Jan. 24, 2019

(30) Foreign Application Priority Data

Feb. 17, 2016   (JP) .................................. 2016-028404

(51) Int. Cl.
*H04R 29/00*   (2006.01)
*H03G 5/00*   (2006.01)
(Continued)

(52) U.S. Cl.
CPC ............... *H03G 5/005* (2013.01); *H04R 1/02* (2013.01); *H04R 3/00* (2013.01); *H04R 3/04* (2013.01);
(Continued)

(58) Field of Classification Search
CPC . H04R 1/02; H04R 3/04; H04R 29/00; H04R 29/001; H04R 3/007; H04R 2420/05; H04R 3/00
(Continued)

(56) References Cited

U.S. PATENT DOCUMENTS

| 4,888,808 | A | 12/1989 | Ishikawa et al. |
| 8,515,090 | B2 * | 8/2013 | Morishima .......... G10K 11/178 381/58 |
| 9,247,365 | B1 * | 1/2016 | Ellis ..................... H04R 29/001 |
| 9,362,878 | B1 * | 6/2016 | Su .......................... H03G 3/007 |
| 9,866,180 | B2 * | 1/2018 | Lesso .................... H03F 1/3241 |
| 2005/0163324 | A1 * | 7/2005 | Neunaber ................. H03F 1/52 381/55 |

(Continued)

FOREIGN PATENT DOCUMENTS

EP        1657962 A2     5/2006
JP        61-159896      7/1986
(Continued)

OTHER PUBLICATIONS

International Search Report of PCT application No. PCT/JP2016/004236 dated Dec. 6, 2016.
(Continued)

*Primary Examiner* — Disler Paul
(74) *Attorney, Agent, or Firm* — McDermott Will & Emery LLP

(57) ABSTRACT

An audio reproduction device includes: a signal amplifier that amplifies an input signal; a characteristic measuring device that obtains a characteristic of the speaker device based on a supply signal obtained by using, as the input signal, a measurement signal having a predetermined frequency characteristic; a structure analyzer that identifies a structure of the speaker device based on a result obtained by the characteristic measuring device; a delay characteristic
(Continued)

calculator that calculates a delay characteristic of the speaker device according to the identified structure of the speaker device; a correction parameter generator that generates a correction parameter based on a difference between the delay characteristic calculated by the delay characteristic calculator and a target delay characteristic; and a corrector that corrects the input signal input to the signal amplifier based on the correction parameter generated by the correction parameter generator.

6 Claims, 10 Drawing Sheets

(51) Int. Cl.
  *H04R 3/00* (2006.01)
  *H04R 3/04* (2006.01)
  *H04R 5/04* (2006.01)
  *H04R 1/02* (2006.01)
(52) U.S. Cl.
  CPC ............... *H04R 5/04* (2013.01); *H04R 29/00* (2013.01); *H04R 29/001* (2013.01); *H04R 2420/05* (2013.01)
(58) Field of Classification Search
  USPC .......................... 381/55, 58–59, 103, 98–99
  See application file for complete search history.

(56) References Cited

U.S. PATENT DOCUMENTS

| | | | |
|---|---|---|---|
| 2007/0127738 A1 | 6/2007 | Yamada et al. | |
| 2010/0290643 A1 | 11/2010 | Mihelich et al. | |
| 2013/0044888 A1* | 2/2013 | Nystrom | H04R 29/001 381/59 |
| 2013/0259245 A1* | 10/2013 | Cheng | H04R 3/00 381/58 |
| 2015/0237444 A1* | 8/2015 | Kiadeh | H04R 3/04 381/103 |
| 2016/0150335 A1* | 5/2016 | Qutub | H04R 29/001 381/59 |

FOREIGN PATENT DOCUMENTS

| | | |
|---|---|---|
| JP | 63-281508 | 11/1988 |
| JP | 2005-184040 | 7/2005 |
| WO | 2015/143127 A1 | 9/2015 |

OTHER PUBLICATIONS

The Extended European Search Report dated Jan. 25, 2019 for the related European Patent Application No. 16890435.7.

* cited by examiner

AUDIO REPRODUCTION DEVICE

This application is a U.S. national stage application of the PCT International Application No. PCT/JP2016/004236 filed on Sep. 16, 2016, which claims the benefit of foreign priority of Japanese patent application No. 2016-028404 filed on Feb. 17, 2016, the contents all of which are incorporated herein by reference.

TECHNICAL FIELD

The present disclosure relates to an audio reproduction device which amplifies an input signal to drive a speaker device.

BACKGROUND ART

An audio reproduction device (so-called audio amplifier) is a device which supplies a supply signal obtained by amplifying an input signal to a speaker device to drive a speaker so that a sound is reproduced by the speaker device. On the other hand, it is known that, even if an identical signal is input from the audio reproduction device to a speaker device, the sound reproduced by the speaker device varies depending on the structure of the cabinet, for example, the cabinet is of the bass reflex type or the sealed type, or the kind of the speaker mounted to the cabinet. In other words, the speaker devices have their respective characteristics depending on the kinds of the speaker devices. Therefore, it is difficult for a speaker device connected to an audio reproduction device to realize an ideal characteristic by itself. Accordingly, some audio reproduction devices electrically correct the signal to be supplied to a speaker device.

PTL1 discloses an audio amplifier. For example, the audio amplifier disclosed in PTL1, in a speaker device having two kinds of speakers, has a filter means that processes an input signal based on a correction characteristic of impulse response of each of the speakers to correct a phase shift of a sound wave radiated from a driving surface of each of the speakers. With this feature, this audio amplifier can obtain a flat frequency characteristic of the sound reproduced by the speaker device.

CITATION LIST

Patent Literature

PTL 1: Unexamined Japanese Patent Publication No. 2005-184040

SUMMARY

To know the characteristic of a speaker device in the conventional art, it is necessary to previously measure a sound reproduced by the speaker device using a microphone or the like. The frequency characteristic of the sound reproduced by the speaker device connected to an audio amplifier can be made flat by calculating a correction parameter based on the measured result and installing the correction parameter into the audio amplifier.

Therefore, to make the frequency characteristic of the sound reproduced by a speaker device used by a user flat, it is necessary to calculate a correction parameter corresponding to the speaker device. For this purpose, it is necessary to place a measuring microphone to measure a reproduced sound from the speaker device, and calculate a correction parameter based on the measured result. Then, a work is necessary to install the calculated correction parameter into an audio amplifier for driving the speaker device.

The present disclosure provides an audio reproduction device that can easily measure a characteristic of a speaker device connected to the audio reproduction device, calculate a correction parameter for reproducing a desired sound based on a measured result, and reflect the correction parameter on a supply signal supplied to the speaker device.

An audio reproduction device according to the present disclosure is an audio reproduction device that amplifies an input signal (an electric power) which is an audio signal to obtain a supply signal, and outputs the supply signal to a speaker device connected to the audio reproduction device. The audio reproduction device includes: a signal amplifier that amplifies an input signal; a characteristic measuring device that obtains a characteristic of the speaker device based on a supply signal obtained by using, as the input signal, a measurement signal having a predetermined frequency characteristic; a structure analyzer that identifies a structure of the speaker device based on a result obtained by the characteristic measuring device; a delay characteristic calculator that calculates a delay characteristic of the speaker device according to the identified structure of the speaker device; a correction parameter generator that generates a correction parameter based on a difference between the delay characteristic calculated by the delay characteristic calculator and a target delay characteristic; and a corrector that corrects the input signal input to the signal amplifier based on the correction parameter generated by the correction parameter generator.

The audio reproduction device according to the present disclosure can by itself measure the characteristic of the speaker device connected to the audio reproduction device, and calculate an appropriate correction parameter. Accordingly, it is possible by a speaker device driven by the audio reproduction device to reproduce a sound with an appropriate frequency characteristic based on an input signal.

DESCRIPTION OF EMBODIMENTS

Figure 1:
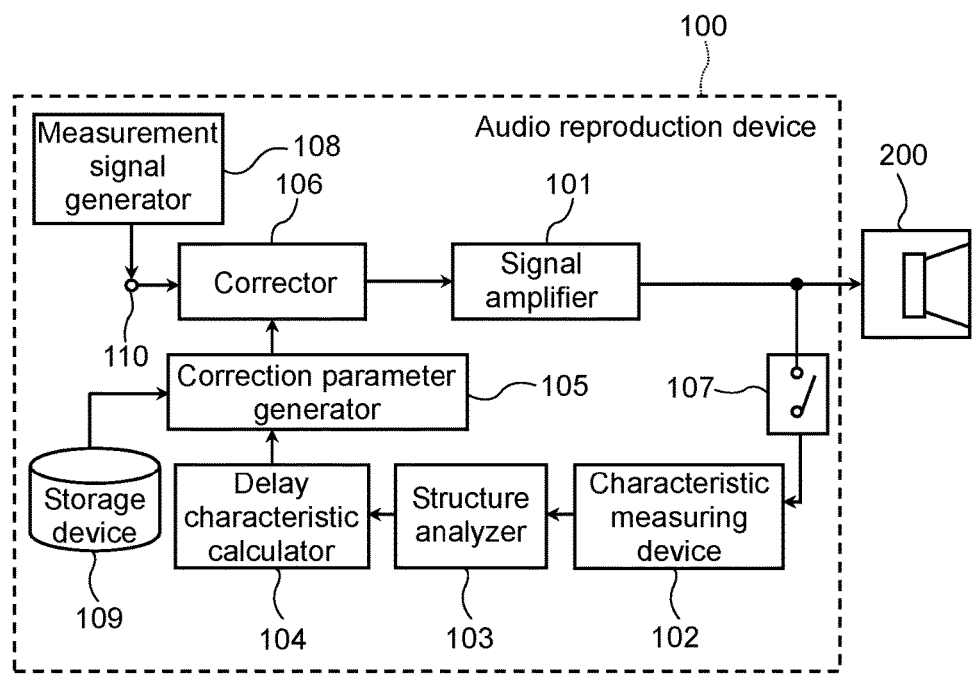
FIG. 1 is a block diagram schematically illustrating a configuration example of an audio reproduction device in accordance with a first exemplary embodiment.

Next, exemplary embodiments of an audio reproduction device in accordance with the present disclosure will be described with reference to the drawings. Note that, each of the following exemplary embodiments is merely an example of the audio reproduction device in accordance with the present disclosure. Accordingly, the scope of the present disclosure should be defined by the wording of the claims with reference to the following exemplary embodiments, and should not be limited to the following exemplary embodiments. Therefore, among the components included in the following exemplary embodiments, those components that are not described in an independent claim defining the most generic concept of the present disclosure are not indispensable to achieve the object of the present disclosure, but will be described as components for configuring a more preferable form.

Also, it should be noted that the following description and the accompanying drawings are provided to allow any person skilled in the art to fully understand the present disclosure, and that it is not intended to limit the subject matter described in the claims by the following description.

Also, each figure in the drawings is a schematic figure in which an omission, an emphasis or adjustment of the proportion may occasionally be made to illustrate the present disclosure, and thus may not always be drawn accurately and may sometimes be different from an actual shape, positional relation or ratio. Also, substantially identical components are denoted by identical reference marks throughout the drawings, and duplicate description on them may sometimes be omitted or simplified.

First Exemplary Embodiment

1. Audio Reproduction Device

FIG. 1 is a block diagram schematically illustrating a configuration example of audio reproduction device 100 in accordance with a first exemplary embodiment.

As shown in FIG. 1, audio reproduction device 100 is a device that amplifies an input signal (an audio signal) input to input terminal 110 to obtain a supply signal, and outputs the supply signal to speaker device 200 connected to audio reproduction device 100. Audio reproduction device 100 includes signal amplifier 101, characteristic measuring device 102, structure analyzer 103, delay characteristic calculator 104, correction parameter generator 105, and corrector 106. Also, audio reproduction device 100 in accordance with the present exemplary embodiment further includes input terminal 110, switch 107, measurement signal generator 108, and storage device 109.

1-1. Signal Amplifier

Signal amplifier 101 is a so-called audio amplifier. Signal amplifier 101 amplifies the power of an input signal which is input, for example, from a compact disc (CD) player or the like to a power that is large enough to drive a speaker of speaker device 200. In the present exemplary embodiment, the kind of signal amplifier 101 may not particularly be limited. For example, an audio amplifier that can be used as signal amplifier 101 may be an analog audio amplifier, which amplifies the power of an analog signal, or a digital audio amplifier, which amplifies the power of a digital signal.

1-2. Characteristic Measuring Device

Characteristic measuring device 102 is a device that obtains a characteristic of speaker device 200. Characteristic measuring device 102 obtains a characteristic of speaker device 200 by measuring an output signal of signal amplifier 101 when the speaker of speaker device 200 generates a sound by a supply signal supplied from signal amplifier 101 to speaker device 200.

The characteristic of speaker device 200 is a frequency characteristic of impedance of speaker device 200. The characteristic of speaker device 200 is measured based on a supply signal generated by signal amplifier 101 by amplifying a measurement signal having a predetermined frequency characteristic, which is input to input terminal 110 as the input signal.

In the present exemplary embodiment, characteristic measuring device 102 is connected through switch 107 to a cable which connects signal amplifier 101 and speaker device 200. Characteristic measuring device 102 functions when switch 107 is turned to a connecting state (ON) to measure the characteristic of speaker device 200. Switch 107 of audio reproduction device 100 is turned ON (i.e., the characteristic of speaker device 200 is measured) when, for example, a user uses audio reproduction device 100 to which new speaker device 200 is connected. In audio reproduction device 100, switch 107 is automatically turned to a disconnecting state (OFF) when processing of correction parameter generator 105 has been completed. Note that, this switching operation of switch 107 may be performed manually.

Figure 2:
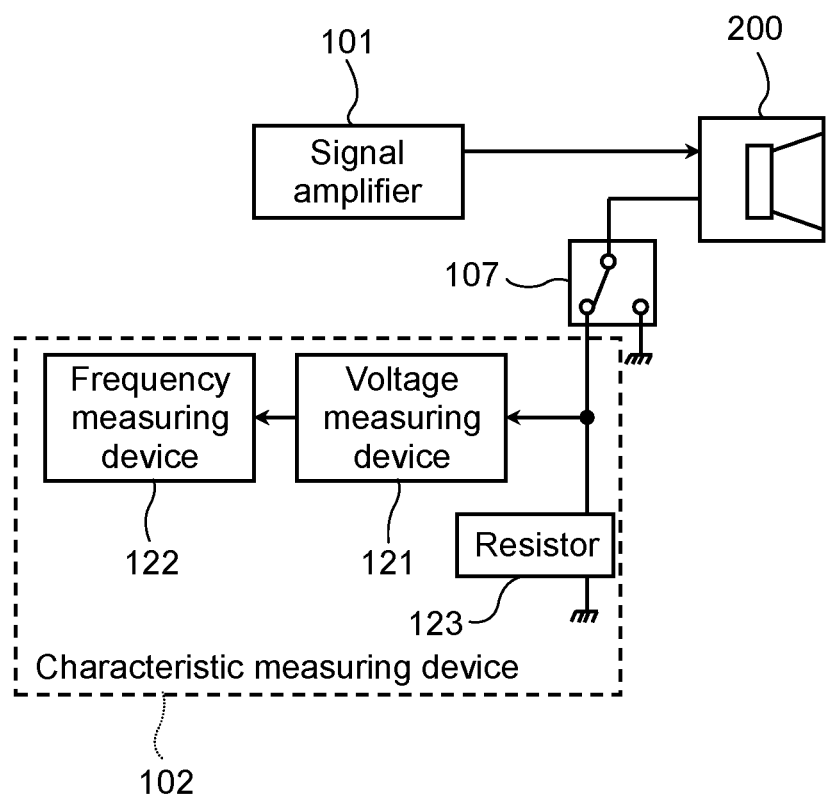
FIG. 2 is a block diagram schematically illustrating a configuration example of a characteristic measuring device included in the audio reproduction device in accordance with the first exemplary embodiment.

FIG. 2 is a block diagram schematically illustrating a configuration example of characteristic measuring device 102 included in audio reproduction device 100 in accordance with the first exemplary embodiment.

As shown in FIG. 2, characteristic measuring device 102 in accordance with the present exemplary embodiment includes voltage measuring device 121, frequency measuring device 122, and resistor 123.

1-2-1. Voltage Measuring Device

Voltage measuring device 121 is a device that measures a voltage generated across both terminals of resistor 123 by a current flowing through speaker device 200 based on the supply signal supplied from signal amplifier 101.

1-2-2. Frequency Measuring Device

Frequency measuring device 122 is a device that measures a frequency characteristic of the voltage measured by voltage measuring device 121.

In audio reproduction device 100 configured as described above, when switch 107 is turned from OFF to ON to insert resistor 123 in series to speaker device 200, the current flowing through speaker device 200 based on the supply signal from signal amplifier 101 flows through resistor 123. Audio reproduction device 100 can measure the impedance characteristic of speaker device 200 by measuring a voltage generated due to the current flowing through resistor 123 by voltage measuring device 121, and measuring a frequency characteristic based on the result of the voltage measurement by frequency measuring device 122.

Figure 3:
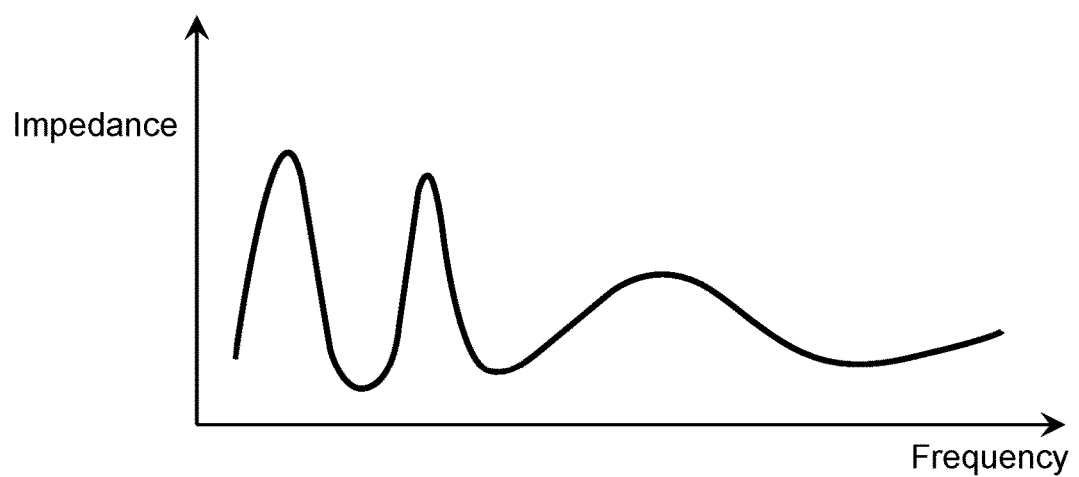
FIG. 3 is a graph showing an example of frequency-impedance characteristic obtained by the characteristic measuring device included in the audio reproduction device in accordance with the first exemplary embodiment.

FIG. 3 is a graph showing an example of a frequency-impedance characteristic obtained by characteristic measuring device 102 included in audio reproduction device 100 in accordance with the first exemplary embodiment.

Characteristic measuring device 102 can obtain data indicating the relation between the frequency and the impedance as shown as an example by the graph of FIG. 3.

Note that, in the present exemplary embodiment, the measurement signal measured by characteristic measuring device 102 may not particularly be limited. For example, the measurement signal may be a signal having a desired frequency band. An example of the measurement signal may be a time stretched pulse signal (TSP signal), which is a sine wave signal with its frequency varying continuously (sweeping) from a relatively higher frequency to a relatively lower frequency (or inversely) in a relatively short time. However, the measurement signal may not be limited to the TSP signal, and may be an impulse signal or any other signals. For example, in a case where the measurement signal is a signal with its frequency sweeping slowly depending on time from a low frequency band to a high frequency band in a frequency range to be measured, frequency measuring device 122 may merely measure time. Also, the measurement signal may contain a frequency component in a predetermined audio band such, for example, as a frequency component of 20 kHz or lower.

1-3. Measurement Signal Generator

In the present exemplary embodiment, the measurement signal having a predetermined frequency characteristic is generated by measurement signal generator 108 included in audio reproduction device 100. The measurement signal generated by measurement signal generator 108 is input to signal amplifier 101.

Note that the measurement signal generator may be provided outside of audio reproduction device 100, and the measurement signal may be input to audio reproduction device 100 from the outside.

1-4. Structure Analyzer

Structure analyzer 103 is a device that identifies a structure of speaker device 200 based on the result obtained by characteristic measuring device 102. Structure analyzer 103 identifies a cabinet structure of speaker device 200 connected to audio reproduction device 100. Cabinet structures to be identified include, for example, a bass reflex type, a sealed type, and a horn type.

Specifically, structure analyzer 103 analyzes an impedance characteristic of speaker device 200. The impedance characteristic has a resonance characteristic in the low frequency region as shown as an example in FIG. 3, and the resonance characteristic has a property dependent on the cabinet structure of speaker device 200. Therefore, structure analyzer 103 derives a peak of the resonance characteristic to identify the cabinet structure of speaker device 200. For example, in a case where the resonance characteristic in the low frequency region (frequency band equal to or lower than a predetermined frequency) has two peaks as shown as an example in FIG. 3, structure analyzer 103 identifies that the structure of speaker device 200 is the bass reflex type. In a case where the resonance characteristic has a single peak, structure analyzer 103 identifies that the structure of speaker device 200 is the sealed type.

1-5. Delay Characteristic Calculator

Delay characteristic calculator 104 is a device that calculates a group delay characteristic or a phase delay characteristic of a reproduced sound of speaker device 200 according to the structure of speaker device 200 identified by structure analyzer 103.

Figure 4:
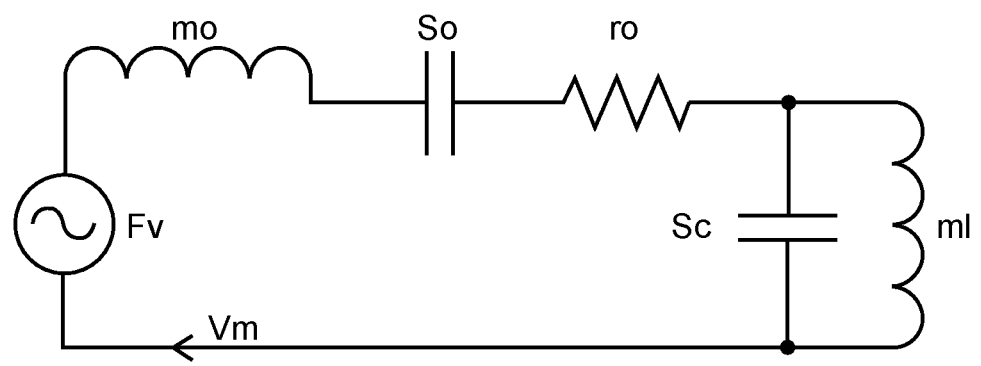
FIG. 4 is a diagram illustrating an equivalent circuit of a bass reflex type speaker device.

Specifically, structure analyzer 103 first identifies the cabinet structure of speaker device 200 as described above. In a case of the operation example shown in the present exemplary embodiment, structure analyzer 103 identifies the structure of speaker device 200 as the bass reflex type based on the characteristic shown as an example in FIG. 3. Note that, FIG. 4 is a diagram illustrating an equivalent circuit of the bass reflex type speaker device.

Next, delay characteristic calculator 104 calculates a group delay characteristic or a phase delay characteristic of the reproduced sound of speaker device 200. The calculation method is as described below. Based on the impedance characteristic obtained by characteristic measuring device 102, delay characteristic calculator 104 identifies mo: a mass of a vibration system, So: a compliance of the vibration system, ro: a damping resistor equivalent circuit, Sc: a compliance of the cabinet, and ml: an equivalent mass of the bass reflex port, in a mechanical system equivalent circuit of the cabinet structure identified by structure analyzer 103 (in the case of the present exemplary embodiment, this equivalent circuit becomes the mechanical system equivalent circuit of the bass reflex cabinet as shown in FIG. 4). Then, based on the feature that a derivative obtained by differentiating a vibration velocity Vm of a voice coil illustrated in FIG. 4 (corresponding to a current in the equivalent circuit) is proportional to the sound pressure, delay characteristic calculator 104 calculates a phase delay characteristic (a group delay characteristic) from a phase-frequency characteristic of the sound pressure.

Figure 5:
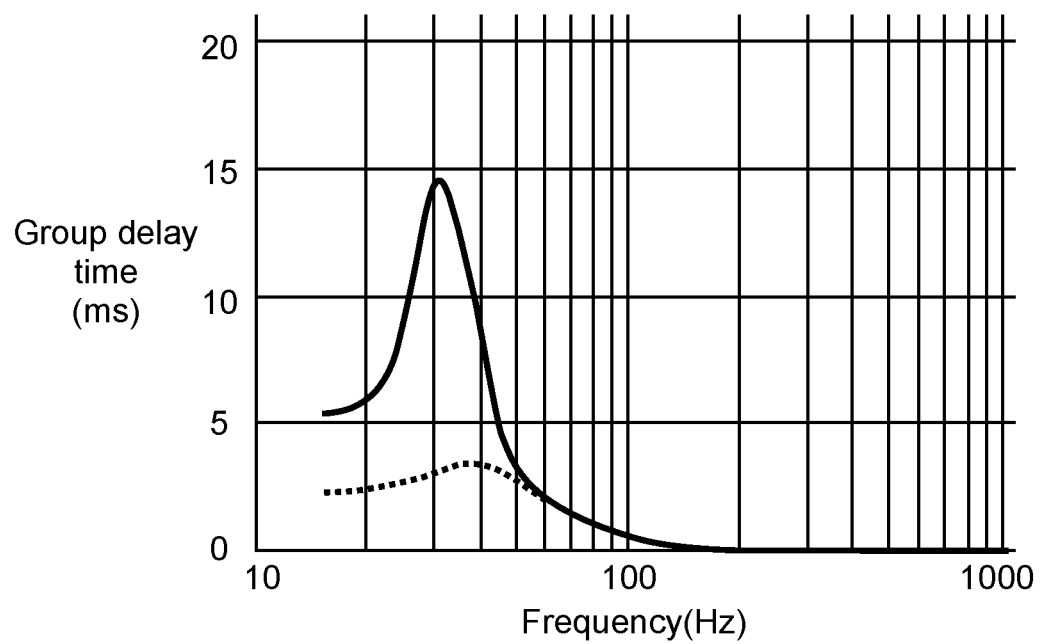
FIG. 5 is a graph showing an example of group delay characteristic in a combination of the audio reproduction device and a speaker device in accordance with the first exemplary embodiment and an example of target group delay characteristic.

FIG. 5 is a graph showing an example of group delay characteristic in the combination of audio reproduction device 100 and speaker device 200 in accordance with the first exemplary embodiment, and an example of the target group delay characteristic. For example, a graph expressing the phase delay characteristic (group delay characteristic) calculated by delay characteristic calculator 104 becomes a characteristic curve as indicated by a solid line in FIG. 5.

1-6. Correction Parameter Generator

Correction parameter generator 105 is a device that generates a correction parameter. Correction parameter generator 105 generates a correction parameter based on a difference between the delay characteristic, which is the phase delay characteristic (group delay characteristic) calculated by delay characteristic calculator 104, and a target delay characteristic.

As a specific example, an example of generating a correction parameter will be described in a case that a target delay characteristic as indicated by a broken line in the graph of FIG. 5 is set, and the input signal is corrected so that the delay characteristic becomes close to the target delay characteristic.

A speaker device having the phase delay characteristic (group delay characteristic) as indicated by the broken line in the graph of FIG. 5 is the sealed type speaker device. FIG.

6 is a circuit diagram illustrating an equivalent circuit of the sealed type speaker device. In the present exemplary embodiment, a parameter that can realize the target delay characteristic is previously set based on the equivalent circuit (the mechanical system equivalent circuit shown in FIG. 6) corresponding to the sealed type speaker device, and the parameter is stored in storage device 109 (see FIG. 1).

Correction parameter generator 105 generates a correction parameter based on a difference between the delay characteristic obtained by the measurement and the target delay characteristic. Specifically, correction parameter generator 105 compares the parameter used by delay characteristic calculator 104 to calculate the delay characteristic and the parameter previously set and stored in storage device 109 to each other, and generates a difference between the compared parameters as a correction parameter.

Figure 6:
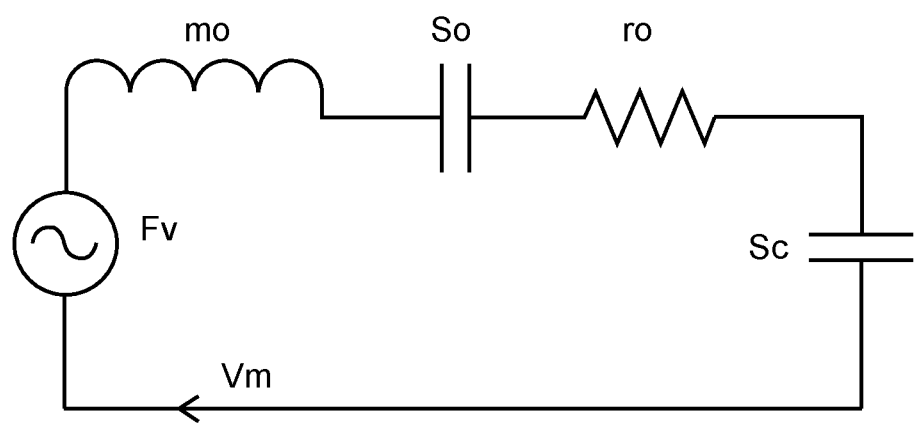
FIG. 6 is a circuit diagram illustrating an equivalent circuit of a sealed type speaker device.

Although such a configuration example has been described in the above exemplary embodiment that the parameter which can realize the target delay characteristic is previously set and stored in storage device 109, the following configuration may also be possible in a case, for example, where the target delay characteristic is set as that of the sealed cabinet. The lowest resonance frequency of the sealed cabinet is made approximately the same as the anti-resonance frequency of the bass reflex cabinet, and the constants of the mechanical system equivalent circuit shown in FIG. 6 are identified based on each of the constants of the mechanical system equivalent circuit shown in FIG. 4. Then, a delay characteristic of a reproduced sound from the sealed cabinet is calculated, and the calculated result is determined as the target characteristic.

Although such a configuration example has been described in the above exemplary embodiment that uses the delay characteristic of the sealed type speaker device as the target delay characteristic, the present disclosure is not limited to this configuration. The target delay characteristic may be a flat characteristic or may be a delay characteristic of the horn type speaker device. Also, the target delay characteristic may be a delay characteristic of a special speaker device that is used, for example, in a concert hall.

Further, a plurality of delay characteristics which are different in kind from one another and their corresponding parameters may be previously stored in storage device 109, and a selector that can select one of these may be included in audio reproduction device 100. With this configuration, correction parameter generator 105 may generate a correction parameter based on a target delay characteristic selected by a user by operating the selector.

1-7. Corrector

Corrector 106 is a device that obtains the correction parameter generated by correction parameter generator 105, corrects the input signal based on the obtained correction parameter, and outputs the corrected input signal to signal amplifier 101. Corrector 106 corrects the input signal so that the sound generated from speaker device 200 becomes the same as a sound generated from a speaker device having the target delay characteristic, and outputs the corrected input signal to signal amplifier 101. Signal amplifier 101 outputs to speaker device 200 a supply signal based on the corrected input signal. This allows speaker device 200 to generate a sound approximating a sound generated from a speaker device having the target delay characteristic.

Specifically, corrector 106 stores the correction parameter generated by correction parameter generator 105, and corrects the input signal based on the correction parameter. Corrector 106 corrects the input signal by performing a convolution operation using, for example, finite impulse response (FIR). Corrector 106 performs processes to calculate an impulse response by performing inverse fast Fourier transformation (inverse FFT) on a value which is based on the calculated correction parameter, and to convolute its result into the input signal.

In the present exemplary embodiment, the method of correction performed by corrector 106 may not be limited to the above-described method. For example, corrector 106 may perform the FFT on the input signal, multiply the operation result of the FFT by the value obtained from the correction parameter, and perform the inverse FFT on the result of the multiplication.

The correction parameter stored in corrector 106 is a parameter that does not correct the input signal during when measurement signal generator 108 is connected to input terminal 110.

It has been described in the present exemplary embodiment that characteristic measuring device 102 is configured to measure the voltage generated across both ends of resistor 123 when speaker device 200 and resistor 123 are connected in series, as shown in FIG. 2. However, characteristic measuring device 102 may not be limited to this configuration. Since the output resistance of signal amplifier 101 is not zero, the output of signal amplifier 101 has a frequency characteristic which is correlated to the impedance of speaker device 200. For this reason, as exemplary shown in FIG. 1, characteristic measuring device 102 may be configured to measure the output of signal amplifier 101 by voltage measuring device 121 in the state that speaker device 200 is connected to signal amplifier 101.

Second Exemplary Embodiment

Next, audio reproduction device 100a in accordance with a second exemplary embodiment will be described with reference to FIG. 7 to FIG. 10.

Audio reproduction device 100a shown in the second exemplary embodiment has substantially the same configuration as audio reproduction device 100 described in the first exemplary embodiment. However, audio reproduction device 100a shown in the second exemplary embodiment has some differences from audio reproduction device 100 described in the first exemplary embodiment. Hereinafter, description on the matters already described in the first exemplary embodiment will occasionally be omitted, and the differences from the first exemplary embodiment will mainly be described.

In the following description, components which are substantially the same as those included in audio reproduction device 100 shown in the first exemplary embodiment will be indicated by identical reference marks, and description on them will sometimes be omitted.

2. Audio Reproduction Device

Figure 7:
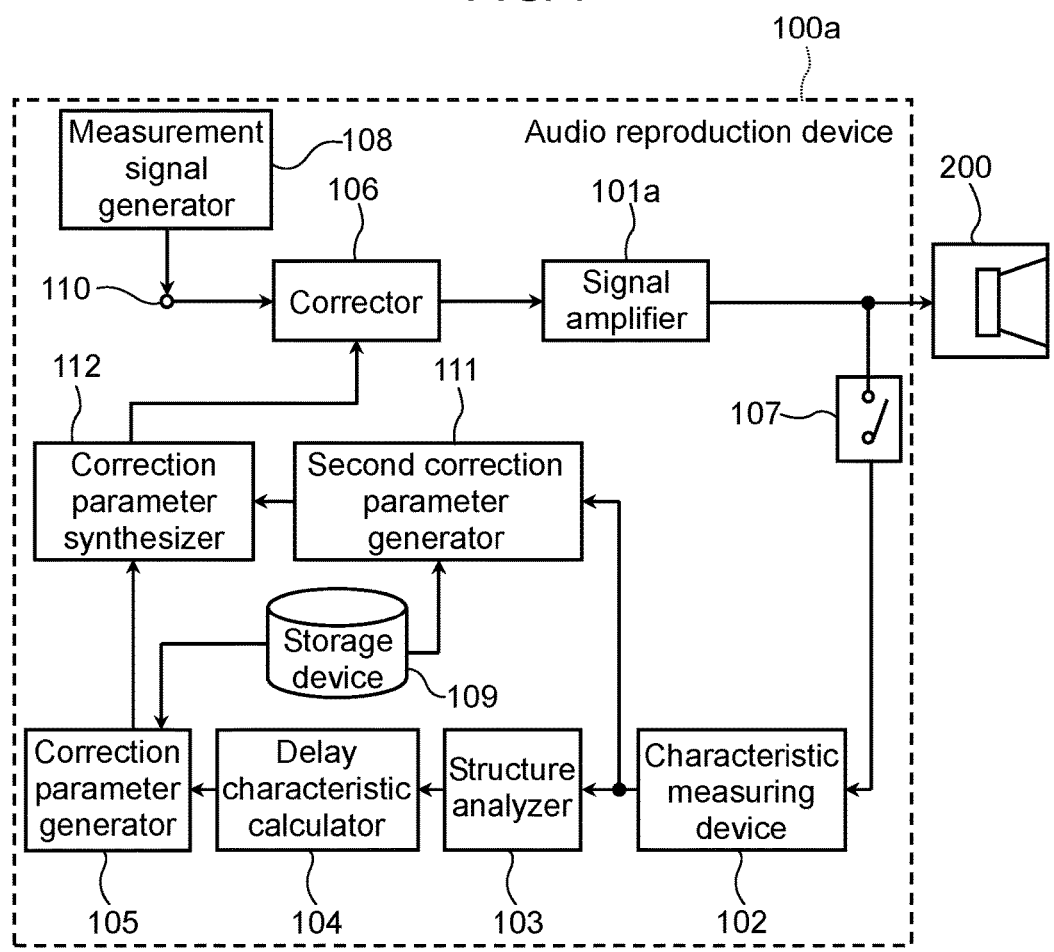
FIG. 7 is a block diagram schematically illustrating a configuration example of an audio reproduction device in accordance with a second exemplary embodiment.

FIG. 7 is a block diagram schematically illustrating a configuration example of audio reproduction device 100a in accordance with the second exemplary embodiment.

Audio reproduction device 100a in accordance with the second exemplary embodiment has signal amplifier 101a in place of signal amplifier 101 included in audio reproduction device 100 shown in the first exemplary embodiment. Further, audio reproduction device 100a includes second correction parameter generator 111, and correction parameter synthesizer 112, in addition to the components included in audio reproduction device 100 shown in the first exemplary embodiment.

2-1. Signal Amplifier

Figure 8:
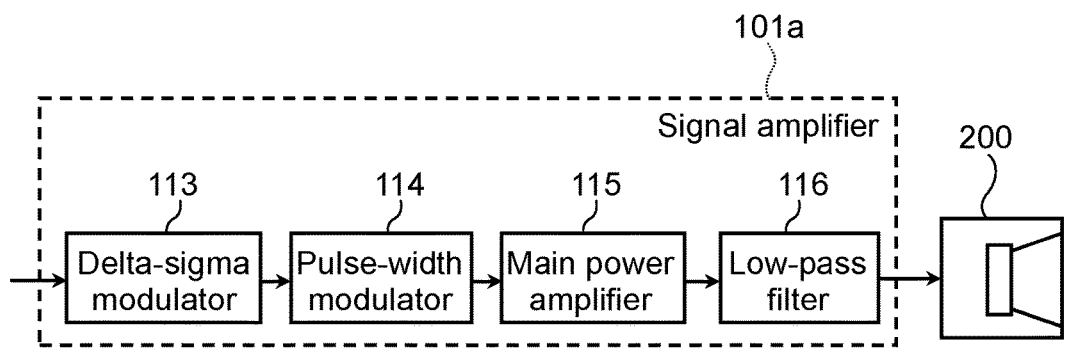
FIG. 8 is a block diagram schematically illustrating a configuration example of a signal amplifier included in the audio reproduction device in accordance with the second exemplary embodiment.

FIG. 8 is a block diagram schematically illustrating a configuration example of signal amplifier 101a included in audio reproduction device 100a in accordance with the second exemplary embodiment.

In the second exemplary embodiment, signal amplifier 101a is a class-D power amplifier. As shown in FIG. 8, signal amplifier 101a includes delta-sigma modulator 113, pulse-width modulator 114, main power amplifier 115, and low-pass filter 116.

Signal amplifier 101a, which is a class-D power amplifier, is a device that converts a digital input signal (e.g., a 16-bit input signal in a case where the sound source is a compact disc) to a 1-bit binary signal by delta-sigma modulator 113 and pulse-width modulator 114, amplifies the power of the binary signal by main power amplifier 115, and removes an unnecessary frequency band from the power-amplified binary signal by low-pass filter 116 to extract a supply signal. Details of these operations will be described hereinafter.

2-1-1. Delta-Sigma Modulator

Figure 9:
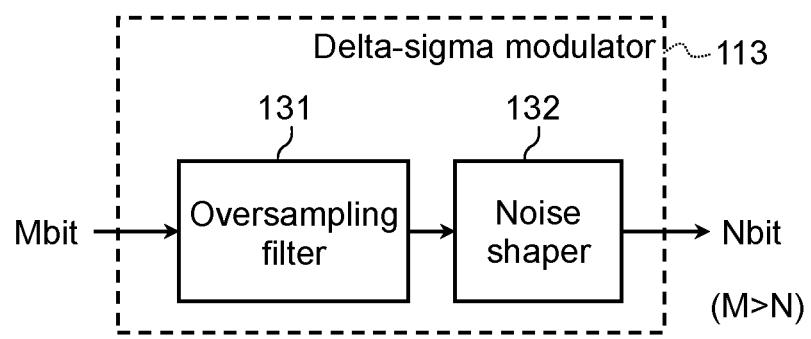
FIG. 9 is a block diagram schematically illustrating a configuration example of a delta-sigma modulator included in the audio reproduction device in accordance with the second exemplary embodiment.

FIG. 9 is a block diagram schematically illustrating a configuration example of delta-sigma modulator 113 included in audio reproduction device 100a in accordance with the second exemplary embodiment.

Delta-sigma modulator 113 is a device that makes the dynamic range of the input signal (the dynamic range determined depending on the quantization bit rate of the digital input signal which is input from input terminal 110) to be within a predetermined band (e.g., the human-audible band in the range up to 20 kHz) to reduce the quantization bit rate of the output signal from that of the input signal.

Specifically, as shown in FIG. 9, delta-sigma modulator 113 is configured by including oversampling filter 131, and noise shaper 132. The input signal to delta-sigma modulator 113 may, for example, be a 16-bit signal, and the output signal from delta-sigma modulator 113 may, for example, be a 3-bit signal.

Note that the numbers of bits of the input signal and the output signal to and from delta-sigma modulator 113 may not be limited to the above-mentioned numbers. The input signal to delta-sigma modulator 113 may be an M-bit signal (M is an integer equal to or larger than 1), and the output signal from delta-sigma modulator 113 to pulse-width modulator 114 may be an N-bit signal (N is an integer larger than 1 satisfying M>N). Specific value of M may, for example, be 16, 20 or 24.

Oversampling filter 131 converts a sampling frequency for the digital audio signal, which is the input signal, into a power-of-two times the original sampling frequency (i.e., performs oversampling), and removes the aliasing from the input signal.

Noise shaper 132 re-quantizes the oversampled digital audio signal by a quantization bit rate smaller than that of the input signal. Noise shaper 132 reduces the re-quantization noise generated by re-quantization (so-called noise floor) in the audio band (e.g., band equal to or lower than 20 kHz).

2-1-2. Pulse-Width Modulator

Pulse-width modulator 114 is a device that converts the gradation in the amplitude direction (i.e., amplitude level) of the signal output from delta-sigma modulator 113 to a pulse width.

In signal amplifier 101a, the 16-bit input signal is converted to a binary (1-bit) pulse-width modulated signal by delta-sigma modulator 113 and pulse-width modulator 114.

2-1-3. Main Power Amplifier

Main power amplifier 115 is a device that amplifies the power of the pulse-width modulated binary signal, which is the output of pulse-width modulator 114. Specifically, main power amplifier 115 amplifies the power with respect to the amplitude of the pulse-width modulated signal. Main power amplifier 115 amplifies the amplitude of the binary signal to be input to almost the same level as the power-supply voltage so that the reactive voltage reduces to reduce the power loss.

2-1-4. Low-Pass Filter

Figure 10:
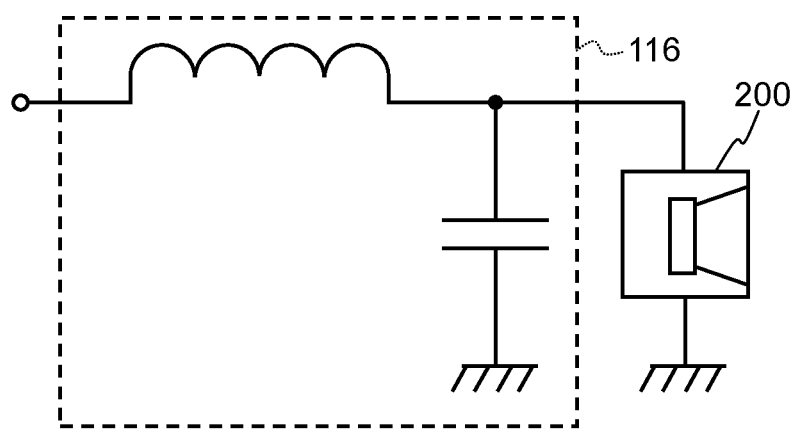
FIG. 10 is a circuit diagram illustrating a configuration example of a low-pass filter included in the audio reproduction device in accordance with the second exemplary embodiment.

FIG. 10 is a circuit diagram illustrating a configuration example of low-pass filter 116 included in audio reproduction device 100a in accordance with the second exemplary embodiment.

Low-pass filter 116 is a device that removes from the output of main power amplifier 115 a carrier signal generated at pulse-width modulator 114 and a re-quantization noise generated at delta-sigma modulator 113 to produce an analog supply signal in the audio band. In the present exemplary embodiment, as shown in FIG. 10, low-pass filter 116 is configured by including a coil and a capacitor to reduce the power loss.

When a pure resistor as a load is connected to the output of low-pass filter 116, a characteristic of low-pass filter 116 (e.g., the Butterworth characteristic) is determined. This characteristic is generally designed so as to have a flat characteristic in the pass band and to attenuate the carrier wave of pulse-width modulator 114 and the re-quantization noise generated at delta-sigma modulator 113 in the stop band.

As described above, signal amplifier 101a, which is a class-D power amplifier, converts a digital audio signal input to input terminal 110 to a binary signal, and amplifies the amplitude of the binary signal to nearly the same level as the power supply voltage. With this configuration, signal amplifier 101a can reduce the power loss at the amplifying element and obtain high power efficiency.

2-2. Characteristic Measuring Device

Characteristic measuring device 102 is connected between low-pass filter 116 provided in signal amplifier 101a and speaker device 200 through switch 107 as shown in FIG. 7 and FIG. 8. As described in the first exemplary embodiment, characteristic measuring device 102 is a device that obtains the characteristic of speaker device 200 by measuring the voltage generated across both ends of resistor 123. Characteristic measuring device 102 measures a frequency-amplitude characteristic and a phase of low-pass filter 116 when a measurement signal is supplied to speaker device 200 through signal amplifier 101a by measuring the voltage generated across both ends of resistor 123, and obtains a characteristic of speaker device 200.

Characteristic measuring device 102 measures the supply signal which is supplied from low-pass filter 116 to speaker device 200 based on the input measurement signal in the same way as in the first exemplary embodiment. Characteristic measuring device 102 measures the impulse response of signal amplifier 101a, which is a class-D power amplifier. Characteristic measuring device 102 performs the fast Fourier transform (FFT) on the measured supply signal, and calculates a frequency-amplitude characteristic and a frequency-phase characteristic of signal amplifier 101a in the state that speaker device 200 is connected.

The TSP signal is a sine wave signal having a phase proportional to a square of its frequency which varies continuously and rapidly (sweeps) from a low frequency band to a high frequency band in a frequency range to be measured. Since the TSP signal has a relatively large energy compared to a single pulse signal, a large signal-noise ratio (S/N) can be easily obtained by synchronously adding the supply signal plural times. Characteristic measuring device 102 calculates an impulse response from the measured supply signal by analyzing its inverse function.

Structure analyzer 103, delay characteristic calculator 104 and correction parameter generator 105 generate a correction parameter based on the frequency-amplitude characteristic obtained from characteristic measuring device 102, in the same way as in the first exemplary embodiment.

2-3. Second Correction Parameter Generator

Next, second correction parameter generator 111 will be described. Second correction parameter generator 111 performs a process of generating a second correction parameter only when switch 107 is turned ON.

Second correction parameter generator 111 calculates a ratio of the frequency-amplitude characteristic obtained by characteristic measuring device 102 and a target frequency-amplitude characteristic selected by a user from one or a plurality of target frequency-amplitude characteristics stored in storage device 109. Second correction parameter generator 111 calculates a second correction parameter regarding the frequency-amplitude characteristic from the calculated ratio.

For example, second correction parameter generator 111 determines a correction content considering a subjective feature of a human who hears sounds. Second correction parameter generator 111 utilizes, for example, the feature that the frequency characteristic sensed by a human ear is geometric. In this case, second correction parameter generator 111 can increase the subjective effect as well as reduce the processing amount by using the octave analysis. Second correction parameter generator 111 divides the frequency-amplitude characteristic obtained by characteristic measuring device 102 into 1/N octave bands (N is a positive integer), and calculates an average value in each divided band. Then, second correction parameter generator 111 calculates a value at each frequency point to be actually processed in the correction process by using each calculated average value, and sets this value as a frequency-amplitude measurement value for calculating the second correction parameter. Similarly, second correction parameter generator 111 also calculates a target frequency-amplitude characteristic value. Then, second correction parameter generator 111 calculates a ratio of the frequency-amplitude measurement value and the target frequency-amplitude characteristic value, and obtains the second correction parameter.

In the manner as described above, second correction parameter generator 111 gives a weight to a specific octave band, when it calculates the second correction parameter of the frequency-amplitude characteristic, considering the aural characteristics of human or a result obtained by a user's own subjective evaluation.

2-4. Correction Parameter Synthesizer

Correction parameter synthesizer 112 is a device that synthesizes the correction parameter obtained by correction parameter generator 105 and the second correction parameter obtained by the second correction parameter generator 111. Correction parameter synthesizer 112 may add the correction parameters to synthesize the parameters, or may use any other synthesizing method.

3. Effects and the Like

As described hereinabove, an audio reproduction device according to the present exemplary embodiment is an audio reproduction device that amplifies an input signal which is an audio signal to obtain a supply signal, and outputs the supply signal to a speaker device connected to the audio reproduction device. The audio reproduction device includes: a signal amplifier that amplifies an input signal; a characteristic measuring device that obtains a characteristic of the speaker device based on a supply signal obtained by using, as the input signal, a measurement signal having a predetermined frequency characteristic; a structure analyzer that identifies a structure of the speaker device based on a result obtained by the characteristic measuring device; a delay characteristic calculator that calculates a delay characteristic of the speaker device according to the identified structure of the speaker device; a correction parameter generator that generates a correction parameter based on a difference between the delay characteristic calculated by the delay characteristic calculator and a target delay characteristic; and a corrector that corrects the input signal input to the signal amplifier based on the correction parameter generated by the correction parameter generator.

Each of audio reproduction device 100 and audio reproduction device 100a is an example of the audio reproduction device. Speaker device 200 is an example of the speaker device. Each of signal amplifier 101 and signal amplifier 101a is an example of the signal amplifier. Characteristic measuring device 102 is an example of the characteristic measuring device. Structure analyzer 103 is an example of the structure analyzer. Delay characteristic calculator 104 is an example of the delay characteristic calculator. Correction parameter generator 105 is an example of the correction parameter generator. Corrector 106 is an example of the corrector.

For example, in the example shown in the exemplary embodiments, audio reproduction device 100 (100a) is an audio reproduction device that amplifies an input signal which is an audio signal to obtain a supply signal, and outputs the supply signal to speaker device 200 connected to audio reproduction device 100 (100a). Audio reproduction device 100 (100a) includes: signal amplifier 101 (101a) that amplifies an input signal; characteristic measuring device 102 that obtains a characteristic of speaker device 200 based on a supply signal obtained by using, as the input signal, a measurement signal having a predetermined frequency characteristic; a structure analyzer 103 that identifies a structure of speaker device 200 based on a result obtained by characteristic measuring device 102; delay characteristic calculator 104 that calculates a delay characteristic of speaker device 200 according to the identified structure of speaker device 200; correction parameter generator 105 that generates a correction parameter based on a difference between the delay characteristic calculated by delay characteristic calculator 104 and a target delay characteristic; and corrector 106 that corrects the input signal input to signal amplifier 101 (101*a*) based on the correction parameter generated by correction parameter generator 105.

Audio reproduction device 100 (100*a*) configured as above can measure a waveform distortion due to a temporal response delay caused by the structure of speaker device 200, particularly, by the cabinet structure, without using a microphone or the like for obtaining a sound generated by speaker device 200. Accordingly, audio reproduction device 100 (100*a*) can easily measure the characteristic of speaker device 200 connected to audio reproduction device 100 (100*a*). Also, based on the measured result, audio reproduction device 100 (100*a*) can produce a supply signal that allows the delay characteristic of a sound reproduced by speaker device 200 to become close to a target delay characteristic.

In the audio reproduction device, the characteristic measuring device may be connected between the signal amplifier and the speaker device. The characteristic measuring device may obtain the characteristic of the speaker device based on a signal which has a correlation to impedance of the speaker device, by measuring the signal which is an output of the signal amplifier when the measurement signal is supplied to the speaker device through the signal amplifier.

For example, in the examples shown in the exemplary embodiments, in audio reproduction device 100 (100*a*), characteristic measuring device 102 is connected between signal amplifier 101 (101*a*) and speaker device 200. Characteristic measuring device 102 obtains the characteristic of speaker device 200 based on the signal which has a correlation to the impedance of speaker device 200, by measuring the signal which is an output of signal amplifier 101 (101*a*) when the measurement signal is supplied to speaker device 200 through signal amplifier 101 (101*a*).

In the audio reproduction device, the signal amplifier may have a low-pass filter connected to the speaker device. The characteristic measuring device may be connected between the low-pass filter and the speaker device. The characteristic measuring device may obtain the characteristic of the speaker device by measuring a frequency, amplitude, and a phase of an output of the low-pass filter when the measurement signal is supplied to the speaker device through the signal amplifier.

Low-pass filter 116 is an example of the low-pass filter.

For example, in the example shown in the second exemplary embodiment, in audio reproduction device 100*a*, signal amplifier 101*a* has low-pass filter 116 connected to speaker device 200. Characteristic measuring device 102 is connected between low-pass filter 116 and speaker device 200. Characteristic measuring device 102 obtains the characteristic of speaker device 200 by measuring a frequency, amplitude, and a phase of an output of low-pass filter 116 when the measurement signal is supplied to speaker device 200 through signal amplifier 101*a*.

The audio reproduction device may further have a storage device that stores a plurality of kinds of the target delay characteristics.

Storage device 109 is an example of the storage device.

For example, in the examples shown in the exemplary embodiments, audio reproduction device 100 (100*a*) further includes storage device 109 that stores a plurality of kinds of the target delay characteristics.

Audio reproduction device 100 (100*a*) configured as above can easily and accurately measure the characteristic of speaker device 200 without using a microphone or the like. Accordingly, based on the measured result, audio reproduction device 100 (100*a*) can make the delay characteristic of a sound reproduced by speaker device 200 connected to audio reproduction device 100 (100*a*) become close to a target delay characteristic.

Further, in a case, for example, where signal amplifier 101 is a class-D power amplifier, audio reproduction device 100*a* can make the sound generated by speaker device 200 become close to a target sound by generating a second correction parameter for correcting the amplitude.

With these features, audio reproduction device 100*a* makes it possible to generate a sound having a user-desired characteristic by speaker device 200 irrespective of the kind of speaker device 200 connected to audio reproduction device 100*a*.

Other Exemplary Embodiments

In the above description, the first and second exemplary embodiments have been described as examples of techniques to be disclosed in the present application. However, the techniques according to the present disclosure are not limited to the above-described exemplary embodiments. For example, other exemplary embodiments that can be realized by arbitrarily combining the components described in the present description or by excluding some of the components described in the present description may be made as exemplary embodiments of the present disclosure. Further, such modified embodiments may be included in the present disclosure that can be obtained by modifying the above-described exemplary embodiments in various manners conceived by any persons having ordinary skill in the art without departing from the spirit of the present disclosure or from the meaning of the languages described in the claims.

Some of such other exemplary embodiments will be exemplified hereinafter.

For example, the measurement signal may not be limited to the TSP signal, but may be white noise, swept sine wave, or the like.

Audio reproduction device 100 (100*a*) may not include measurement signal generator 108. A measurement signal may be externally input to audio reproduction device 100 (100*a*).

Although, in the exemplary embodiments, audio reproduction device 100 (100*a*) has been described as an all-in-one device, but one or more devices configuring audio reproduction device 100 (100*a*) may be provided as separate devices. Further, each device may function as a program implemented in a computer or as a processing unit configuring a part of the program.

Audio reproduction device 100 (100*a*) may generate a correction parameter, then correct the measurement signal, which is the input signal, by the correction parameter, and then measure by characteristic measuring device 102 a supply signal generated by amplifying the corrected measurement signal to confirm the result of correction. Further, in a case where the result of correction does not reach a target characteristic, audio reproduction device 100 (100*a*) may again generate a correction parameter based on the measured result.

In the above description, exemplary embodiments have been described as examples of techniques according to the present disclosure. For the purpose of the description, the accompanying drawings and the detailed description have been provided.

Accordingly, the components shown in the drawings and described in the detailed description may possibly include not only components that are essential to solve the problems, but also components that are for exemplifying the above-described techniques and thus are not essential to solve the problems. Therefore, it should not immediately recognize that such non-essential components are essential merely for the reason that they are shown in the drawings or described in the detailed description.

Also, since the above-described exemplary embodiments are for exemplifying the techniques according to the present disclosure, various modifications, substitutions, additions or omissions may be made within the scope of the claims and equivalents thereof. Also, the components described in the above first and second exemplary embodiments can be appropriately combined to configure a new exemplary embodiment.

INDUSTRIAL APPLICABILITY

The audio reproduction device of the present disclosure is applicable to home audio amplifiers, industrial audio amplifiers, and the like.

REFERENCE MARKS IN THE DRAWINGS 100, 100a audio reproduction device
101, 101a signal amplifier
102 characteristic measuring device
103 structure analyzer
104 delay characteristic calculator
105 correction parameter generator
106 corrector
107 switch
108 measurement signal generator
109 storage device
110 input terminal
111 second correction parameter generator
112 correction parameter synthesizer
113 delta-sigma modulator
114 pulse-width modulator
115 main power amplifier
116 low-pass filter
121 voltage measuring device
122 frequency measuring device
123 resistor
131 oversampling filter
132 noise shaper
200 speaker device

The invention claimed is:

1. An audio reproduction device that amplifies an input signal which is an audio signal to obtain a supply signal, and outputs the supply signal to a speaker device connected to the audio reproduction device, the audio reproduction device comprising:
   a signal amplifier that amplifies an input signal;
   a characteristic measuring device that obtains a characteristic of the speaker device based on a supply signal obtained by using, as the input signal, a measurement signal having a predetermined frequency characteristic;
   a structure analyzer that identifies a structure of the speaker device based on a result obtained by the characteristic measuring device;
   a delay characteristic calculator that calculates a delay characteristic of the speaker device according to the identified structure of the speaker device;
   a correction parameter generator that generates a correction parameter based on a difference between the delay characteristic calculated by the delay characteristic calculator and a target delay characteristic; and
   a corrector that corrects the input signal input to the signal amplifier based on the correction parameter generated by the correction parameter generator.

2. The audio reproduction device according to claim 1, wherein the characteristic measuring device is connected between the signal amplifier and the speaker device, and obtains the characteristic of the speaker device based on a signal which has a correlation to impedance of the speaker device, by measuring the signal which is an output of the signal amplifier when the measurement signal is supplied to the speaker device through the signal amplifier.

3. The audio reproduction device according to claim 1, wherein
   the signal amplifier has a low-pass filter connected to the speaker device, and
   the characteristic measuring device is connected between the low-pass filter and the speaker device, and obtains the characteristic of the speaker device by measuring a frequency, amplitude, and a phase of an output of the low-pass filter when the measurement signal is supplied to the speaker device through the signal amplifier.

4. The audio reproduction device according to claim 1, further comprising a storage device that stores a plurality of kinds of the target delay characteristics.

5. The audio reproduction device according to claim 1, wherein the structure analyzer identifies a cabinet structure of the speaker device based on the result obtained by the characteristic measuring device.

6. The audio reproduction device according to claim 5, wherein the structure analyzer identifies the cabinet structure of the speaker device by deriving a peak of the resonance characteristic.

* * * * *